United States Patent (10) Patent No.: US 8,759,912 B2
Disney et al. (45) Date of Patent: Jun. 24, 2014

(54) HIGH-VOLTAGE TRANSISTOR DEVICE (75) Inventors: Donald R. Disney, Cupertino, CA (US);
Ognjen Milic, San Jose, CA (US); Kun Yi, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 269 days.

(21) Appl. No.: 13/195,199

(22) Filed: Aug. 1, 2011

(65) Prior Publication Data
US 2013/0032895 A1 Feb. 7, 2013

(51) Int. Cl.
*H01L 29/78* (2006.01)
(52) U.S. Cl.
USPC ............ 257/335; 257/E29.026; 257/E29.256; 257/E29.268
(58) Field of Classification Search
CPC ............................ H01L 29/405; H01L 29/404
USPC .................. 257/355, 335, E29.027, E29.256, 257/E29.268
See application file for complete search history.

(56) References Cited

U.S. PATENT DOCUMENTS

| | | | |
|---|---|---|---|
| 6,680,515 B1 | 1/2004 | Hsing | |
| 7,489,007 B2 * | 2/2009 | Williams et al. | 257/335 |
| 2009/0039424 A1 * | 2/2009 | Su et al. | 257/339 |
| 2010/0301414 A1 | 12/2010 | Yoo | |
| 2011/0062554 A1 | 3/2011 | Hsing et al. | |
| 2011/0068377 A1 | 3/2011 | Hsing et al. | |
| 2011/0233670 A1 * | 9/2011 | French et al. | 257/335 |

* cited by examiner

*Primary Examiner* — Jerome Jackson, Jr.
*Assistant Examiner* — Paul Budd
(74) *Attorney, Agent, or Firm* — Perkins Coie LLP (57) ABSTRACT

A high-voltage transistor device comprises a spiral resistive field plate over a first well region between a drain region and a source region of the high-voltage transistor device, wherein the spiral resistive field plate is separated from the first well region by a first isolation layer, and is coupled between the drain region and the source region. The high-voltage transistor device further comprises a plurality of first field plates over the spiral resistive field plate with each first field plate covering one or more segments of the spiral resistive field plate, wherein the plurality of first field plates are isolated from the spiral resistive field plate by a first dielectric layer, and wherein the plurality of first field plates are isolated from each other, and a starting first field plate is connected to the source region.

10 Claims, 6 Drawing Sheets

HIGH-VOLTAGE TRANSISTOR DEVICE

TECHNICAL FIELD

This disclosure relates generally to semiconductor devices, and particularly relates to high-voltage transistors with resistive field plate and capacitive coupling.

BACKGROUND

High-voltage ("HV") transistors are broadly used in integrated high-voltage power management circuits for industrial and consumer electronic devices. For a high-voltage transistor used as a power transistor in such high-voltage power management circuits, of which the input voltage may be as high as 1000V, it is desired that the high-voltage transistor have a high breakdown voltage (i.e. be capable of withstanding high-voltage without damage) to enhance the operational stability of the power management circuits. It is also desired that the high-voltage transistor have a low on-resistance to improve the efficiency of the power management circuits.

Usually, the on-resistance of the high-voltage transistor can be decreased by increasing the doping concentration within a drift region between a drain region and a source region of the high-voltage transistor. However, increasing the doping concentration within the drift region make it more difficult for the drift region to be completely depleted, resulting in a decrease in breakdown voltage. Therefore, it is desired to provide a high-voltage transistor device having low on-resistance without decreasing the breakdown voltage.

Moreover, a high-voltage transistor in the high-voltage power management circuits generally operates with ON/OFF transitions, during which the high-voltage transistor may experience very large and fast drain-to-source voltage changes. For example, when a high-voltage MOS transistor is switched from an ON state to an OFF state, the drain voltage of the MOS transistor may increase rapidly from a relatively low voltage (e.g., 0V-20V) to a quite high voltage (e.g., more than 400V) in a very short time (e.g. less than 1 microsecond), which may cause the high-voltage MOS transistor to break down while it has not yet established the ability to withstand a high voltage as in steady state. Thus, a high-voltage transistor should withstand such large and fast voltage changes without damage during ON/OFF transitions, i.e. the high-voltage transistor should have a high dynamic breakdown voltage.

SUMMARY

In one embodiment, a high-voltage transistor device comprises: a semiconductor layer of a first conductivity type; a source region of a second conductivity type opposite to the first conductivity type in the semiconductor layer; a drain region of the second conductivity type in the semiconductor layer separated from the source region; a first isolation layer atop the semiconductor layer between the source region and the drain region; a first well region of the second conductivity type surrounding the drain region, extending towards the source region and separated from the source region; a gate atop the first isolation layer between the source region and the first well region; a spiral resistive field plate atop the first isolation layer between the drain region and the gate, wherein the spiral resistive field plate comprises a first end and a second end; a first dielectric layer covering the source region, the drain region, the first isolation layer, the gate and the spiral resistive field plate; a source electrode coupled to the source region and the first end of the spiral resistive field plate; a drain electrode coupled to the drain region and the second end of the spiral resistive field plate; and a plurality of first field plates atop the first dielectric layer, wherein the plurality of first field plates are arranged around the source electrode, starting from the source electrode and extending towards the drain electrode, and wherein the plurality of first field plates are isolated from each other, and wherein a starting first field plate of the plurality of first field plates is connected to the source electrode, and wherein each of the plurality of first field plates covers one or more segments of the spiral resistive field plate.

In one embodiment, a method of forming a high-voltage transistor device comprises: providing a semiconductor layer of a first conductivity type; forming a first well region of a second conductivity type opposite to the first conductivity type in the semiconductor layer; forming a drain region of the second conductivity type in the first well region; forming a source region of the second conductivity type in the semiconductor layer; forming a first isolation layer atop the semiconductor layer between the source region and the drain region; forming a gate atop the first isolation layer near the source region; forming a spiral resistive field plate atop the first isolation layer between the drain region and the gate, wherein the spiral resistive field plate comprises a first end and a second end; forming a first dielectric layer covering the source region, the drain region, the first isolation layer, the gate and the spiral resistive field plate; forming a source electrode coupled to the source region and to the first end of the spiral resistive field plate; forming a drain electrode coupled to the drain region and to the second end of the spiral resistive field plate; and forming a plurality of first field plates atop the first dielectric layer, wherein the plurality of first field plates are arranged around the source electrode, starting from the source electrode and extending towards the drain electrode, and wherein the plurality of first field plates are isolated from each other, and wherein a starting first field plate of the plurality of first field plates is connected to the source electrode, and wherein each of the plurality of first field plates covers one or more segments of the spiral resistive field plate.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

The terms "left," "right," "in," "out," "front," "back," "up," "down, "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner.

Figure 1A:
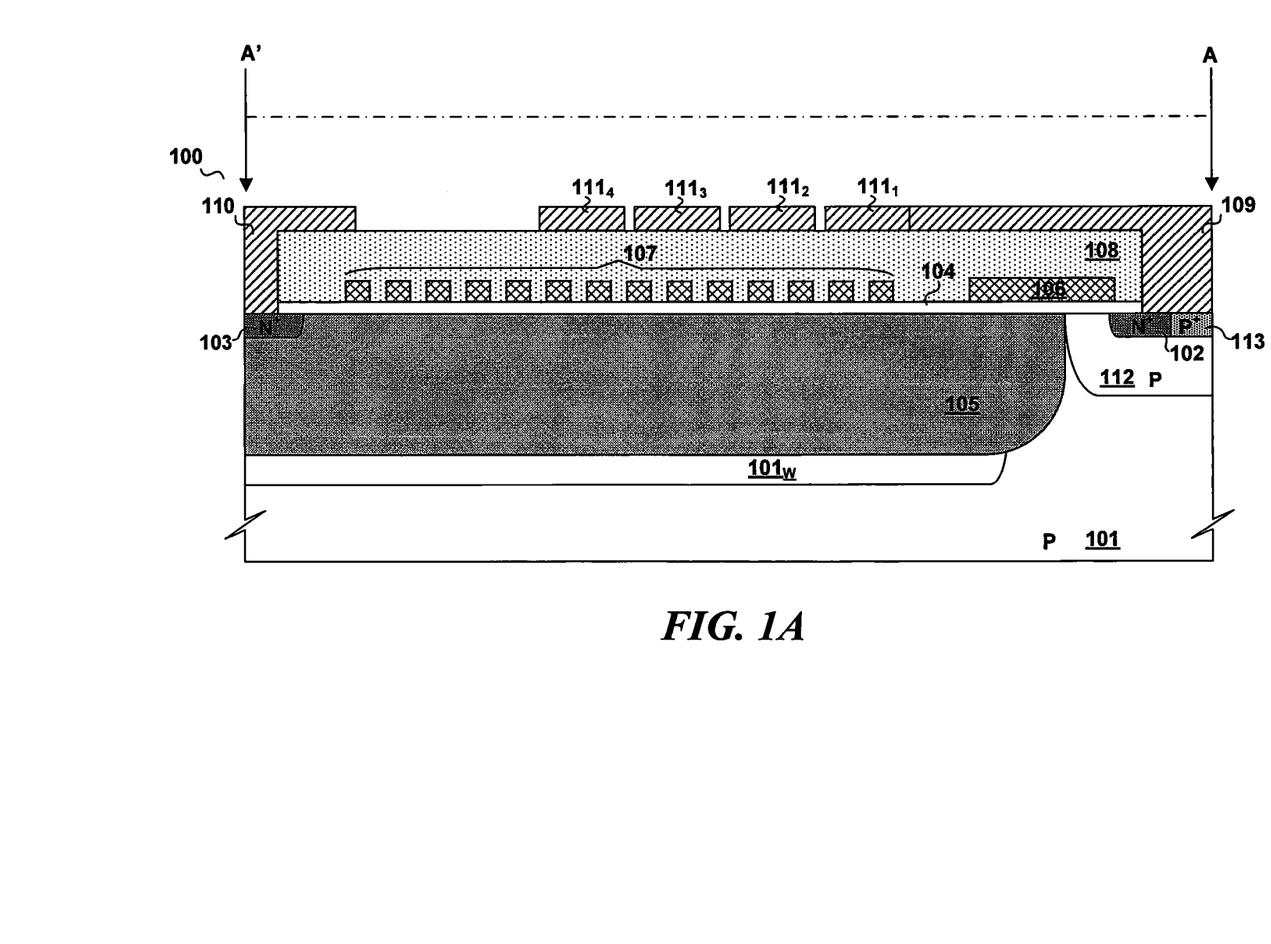
FIG. 1A illustrates a sectional view of a high-voltage transistor device in accordance with an embodiment of the present invention.

FIG. 1A illustrates schematically a sectional view of a high-voltage transistor device 100 in accordance with an embodiment of the present invention. The high-voltage transistor device 100 comprises a semiconductor layer 101 of a first conductivity type (e.g. P-type in FIG. 1A); a source region 102 of a second conductivity type (e.g. N-type in FIG. 1A) opposite to the first conductivity type with a heavy dopant concentration in the semiconductor layer 101; a drain region 103 of the second conductivity type with a heavy dopant concentration (e.g. an N+ region in FIG. 1A) in the semiconductor layer 101 separated from the source region 102; a first isolation layer 104 atop the semiconductor layer 101 between the source region 102 and the drain region 103; a first well region 105 of the second conductivity type surrounding the drain region 103, extending towards the source region 102 and separated from the source region 102; a gate 106 positioned atop the first isolation layer 104 near the source region 102; a spiral resistive field plate 107 atop the first isolation layer 104 between the drain region 103 and the gate 106, wherein the spiral resistive field plate 107 comprises a first end and a second end; a first dielectric layer 108 covering the source region 102, the drain region 103, the first isolation layer 104, the gate 106 and the spiral resistive field plate 107; a source electrode 109 coupled to the source region 102 and the first end of the spiral resistive field plate 107; a drain electrode 110 coupled to the drain region 103 and the second end of the spiral resistive field plate 107; a gate electrode (not shown in FIG. 1A) coupled to the gate; and a plurality of first field plates $111_1$-$111_4$ arranged atop the first dielectric layer 108 around the source electrode 109, starting from the source electrode 109 and extending towards the drain electrode 110; wherein the plurality of first field plates $111_1$-$111_4$ are isolated from each other; and wherein a starting first field plate (e.g. the field plate $111_1$ in FIG. 1A) of the plurality of first field plates $111_1$-$111_4$ is connected to the source electrode 109; and wherein each of the plurality of first field plates $111_1$-$111_4$ covers one or more segments of the spiral resistive field plate 107.

Figure 1B:
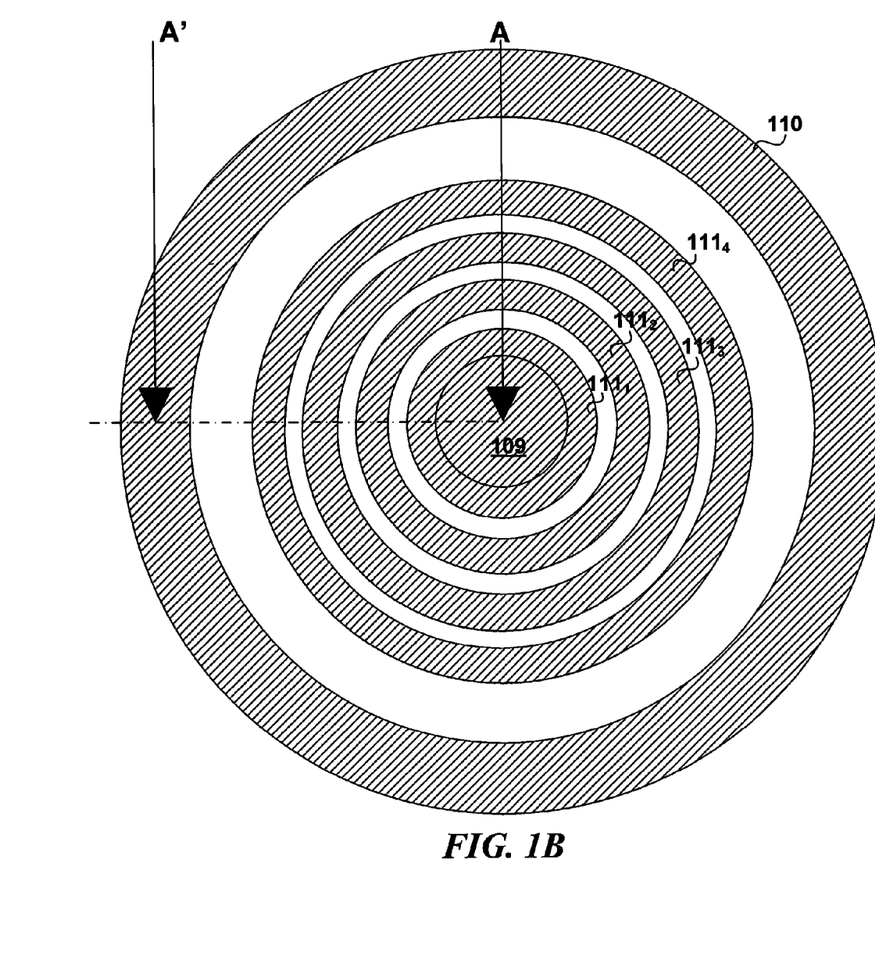
FIG. 1B illustrates a top plan view of the high-voltage transistor device of FIG. 1A.

FIG. 1B illustrates schematically a top plan view of the high-voltage transistor device 100 of FIG. 1A. Referring to FIG. 1A and FIG. 1B together, four first field plates $111_1$-$111_4$ are shown in the present embodiment, all having the same width and same spacing and positioned as concentric circles. In other embodiments, the width of each first field plate, the spacing between adjacent first field plates and the total number of the plurality of first field plates may be modified as required. For example, in one embodiment, the plurality of first field plates $111_1$-$111_4$ may not have the same width, the widths of the first field plates $111_1$-$111_4$ may be respectively about 6 μm, 5 μm, 5 μm, and 3.5 μm, and the spacing between each of the first field plates $111_1$-$111_4$ may be about 0.5 μm. In one embodiment, the plurality of first field plates may extend substantially across the first dielectric layer 108 between the source electrode 109 and the drain electrode 110, with a starting first field plate connected to the source electrode 109, and an ending first field plate approaching the drain electrode 110 and capacitively coupled to the drain electrode 110. In other embodiments, the plurality of first field plates may be arranged in non-circular layouts, for example, in fingertype for high-voltage transistors in fingertype.

In one embodiment, the plurality of first field plates $111_1$-$111_4$ may be isolated from each other by a first dielectric material. For example, the plurality of first field plates $111_1$-$111_4$ may be isolated from each other by a passivation layer (not shown in FIG. 1A).

In one embodiment, the first isolation layer 104 may comprise silicon dioxide. In other embodiment, the first isolation layer 104 may comprise other isolation materials that are compatible with other aspects of the device manufacturing process.

In one embodiment, the gate 106 may comprise doped poly-silicon. In other embodiments, the gate 106 may comprise other conductive materials (e.g., metals, other semiconductors, semi-metals, and/or combinations thereof) that are compatible with other aspects of the device manufacturing process. Thus, the term "poly-silicon" is intended to include such other materials and material combinations in addition to silicon.

In one embodiment, the spiral resistive field plate 107 may comprise a long and narrow resistor formed by medium to high resistivity poly-silicon and arranged as a spiral between the drain region 103 and the gate 106. The width of each segment of the spiral resistive field plate 107 may be about 0.4 μm to 1.2 μm, and the space between each segment may be about 0.4 μm to 1.2 μm. In other embodiments, the spiral resistive field plate 107 may be implemented by any other conventional methods.

In one embodiment, the plurality of first field plates $111_1$-$111_4$ may comprise metal field plates. In other embodiment, the plurality of first field plates $111_1$-$111_4$ may comprise other types of conductive field plates that are formed by other conductive materials.

In accordance with various embodiments of the present invention, the spiral resistive field plate 107 may act as a large resistor coupled between the drain region 103 and the source region 102, allowing only a very small leakage current to flow from the drain region 103 to the source region 102 of the high-voltage transistor device 100 when the high-voltage transistor device is in OFF state and a high voltage is applied on the drain electrode 109. In addition, when a high voltage is applied on the drain electrode 109, the spiral resistive field plate 107 may help to establish a linear voltage distribution along the surface of the first well region 105 between the drain region 103 and the source region 102. The linear voltage distribution may provide a uniform electric field distribution in the first well region 105, alleviating the formation of high electric field locations in the first well region 105, improving the breakdown voltage of the high-voltage transistor device 100. Moreover, the spiral resistive field plate 107 may help to deplete the first well region 105. In that case, the first well region 105 may have a higher dopant concentration than would be possible without the spiral resistive field plate 107, allowing the high-voltage transistor device 100 have a reduced on-resistance without lowering the breakdown voltage.

The plurality of first field plates $111_1$-$111_4$ are capacitively coupled to each other and each first field plate $111_1$-$111_4$ is also capacitively coupled to one or more segments of the spiral resistive field plate 107. Since the first field plate $111_1$ is connected to the source electrode 109, the first end of the spiral resistive field plate 107 is capacitively coupled to the source electrode 109 (i.e. to ground, if the source electrode 109 is connected to ground).

The plurality of first field plates $111_1$-$111_4$ may help to increase a dynamic breakdown voltage of the high-voltage transistor device 100 during a fast transition of a drain to source voltage of the high-voltage transistor device 100. Because the plurality of first field plates $111_1$-$111_4$ are capacitively coupled to each other and to the spiral resistive field plate 107, when a fast transition of the drain to source voltage occurs, they can react very fast so that an adequate distribution of lateral potential across the surface of the first well region 105 can be established in a short time, resulting in the dynamic breakdown voltage of the high-voltage transistor device 100 being increased.

Still referring to FIG. 1A, the high-voltage transistor device 100 may further comprise a second well region 112 of the first conductivity type (e.g. a P-type body region in FIG. 1A) surrounding the source region 102. The second well region 112 may be provided with higher dopant concentration than the semiconductor layer 101, thus increasing the threshold voltage of the high-voltage transistor device 100 and reducing a punch-through leakage between the first well region 105 and the source region 102.

Still referring to FIG. 1A, the high-voltage transistor device 100 may further comprise a body contact region 113 of the first conductivity type with a heavy dopant concentration (e.g. a P+ region in FIG. 1A) next to the source region 102. The body contact region 113 may be coupled to the source electrode 109, as shown in FIG. 1A. In other embodiments, the high-voltage transistor device 100 may further comprise a separate electrode for the body contact region 113, such that the source region 102 can assume a voltage greater than that of the body contact region 113.

In another embodiment, still referring to FIG. 1A, the high-voltage transistor device 100 may further comprise a third well region $101_w$ of the first conductivity type in the semiconductor layer 101 beneath the first well region 105, wherein the third well region $101_w$ has a higher dopant concentration than the semiconductor layer 101. The third well region $101_w$ may help to increase the pinch effect toward the side of the drain region 103. Therefore, the first well region 105 may be doped with a further increased dopant concentration (thereby further decreasing the on-resistance) without reducing the breakdown voltage of the high-voltage transistor device 100.

In still other embodiments, the first end of the spiral resistive field plate 107 may be coupled to the gate 106 or to the body contact region 113 instead of being coupled to the source region 102.

Figure 2:
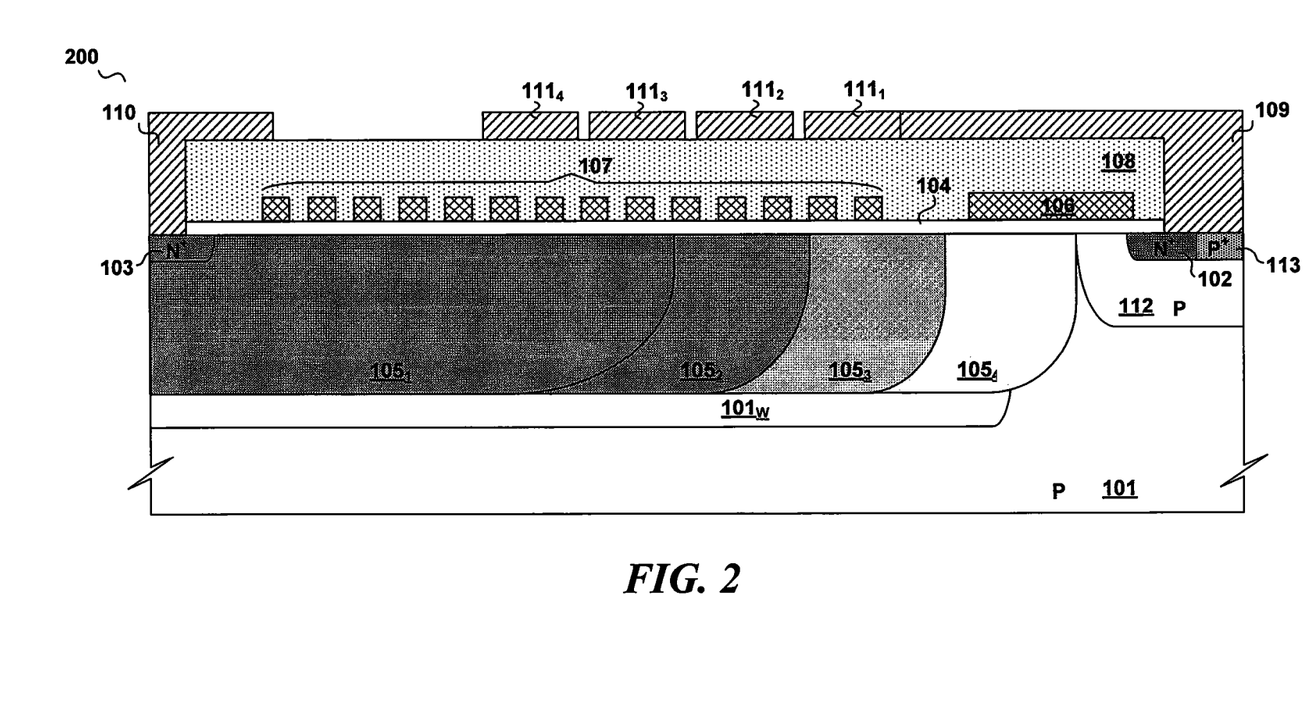
FIG. 2 illustrates a sectional view of a high-voltage transistor device in accordance with another embodiment of the present invention.

FIG. 2 illustrates schematically a sectional view of a high-voltage transistor device 200 in accordance with another embodiment of the present invention. Components or structures in the high-voltage transistor device 200 with substantially the same functions as those of the high-voltage transistor device 100 are indentified by the same reference label as used in the high-voltage transistor device 100 for the sake of simplicity. As illustrated in FIG. 2, the first well region 105 may comprise a plurality of second-conductivity-type dopant zones wherein each second-conductivity-type dopant zone has a different dopant concentration level from the other second-conductivity-type dopant zones. In one embodiment, the plurality of second-conductivity-type dopant zones may have degrading dopant concentrations in the direction from the dopant zone immediately surrounding the drain region to the dopant zone farthest from the drain region. For example, the dopant zone closest to the drain region may have a dopant concentration a little lighter than that of the drain region, the dopant zone furthest to the drain region may have a dopant concentration lighter than that of the dopant zone closer to the drain region. In this case, the on-resistance may be further increased without decreasing the breakdown voltage of the high-voltage transistor device 200, because the first well region 105 is doped lighter near the source region 102, reducing the possibility of premature punch-through near the source region 102.

In the exemplary embodiment shown in FIG. 2, the well region 105 is illustrated as to comprise four second-conductivity-type dopant zones $105_1$-$105_4$, while the drain region 103 is heavy doped with a dopant concentration greater than $1 \times 10^{19}$ cm$^{-3}$, the second-conductivity-type dopant zone $105_1$ immediately surrounding the drain region 103 is doped with a dopant concentration of about $4 \times 10^{12}$ cm$^{-3}$, the second-conductivity-type dopant zones $105_2$, $105_3$ and $105_4$ are respectively doped with a dopant concentration of about $3 \times 10^{12}$ cm$^{-3}$, $2 \times 10^{12}$ cm$^{-3}$ and $1 \times 10^{12}$ cm$^{-3}$. It can be appreciated by those of ordinary skill in the art that the number of the second-conductivity-type dopant zones, the doping concentration of each second-conductivity-type dopant zone, and the width of each second-conductivity-type dopant zone may be modified as required to optimize the performance of the high-voltage transistor device 200.

Figure 3:
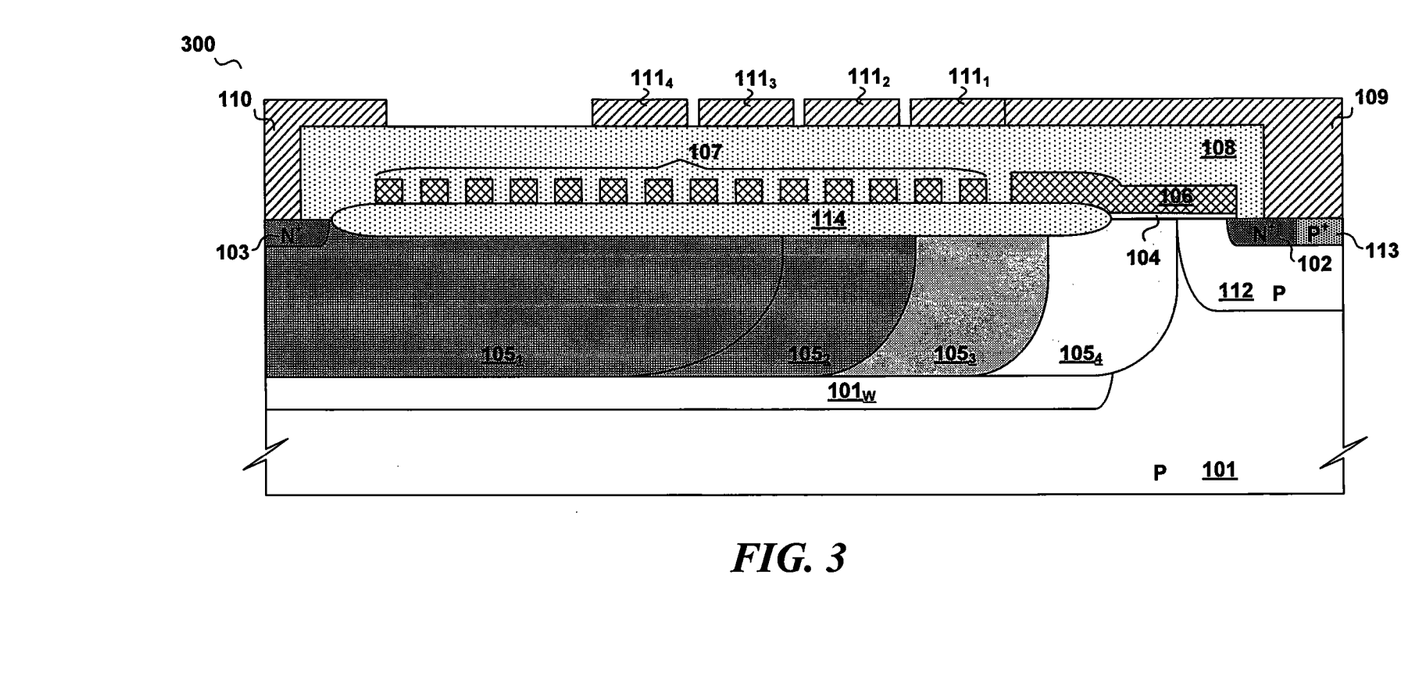
FIG. 3 illustrates a sectional view of a high-voltage transistor device in accordance with another embodiment of the present invention.

FIG. 3 illustrates schematically a sectional view of a high-voltage transistor device 300 in accordance with another embodiment of the present invention. Components or structures in the high-voltage transistor device 300 with substantially the same functions as those of the high-voltage transistor devices 100 or 200 are identified by the same reference label as used in the high-voltage transistor devices 100 or 200 for the sake of simplicity. As illustrated in FIG. 3, the high-voltage transistor device 300 may further comprise a thick dielectric layer 114 (e.g. a thick field oxide layer) over a portion of the first well region 105 to laterally isolate the drain region 103 from the gate 106 and the source region 102, wherein the gate 106 may have a portion extending on top of the thick dielectric layer 114, and wherein the spiral resistive field plate is atop the thick dielectric layer 114 instead of the first isolation layer 108. In one embodiment, the thick dielectric layer 114 may also comprise silicon dioxide.

In the exemplary embodiments shown in FIG. 1A, FIG. 2, and FIG. 3, the capacitive coupling between adjacent first field plates $111_1$-$111_4$ is determined by the lateral spacing between the first field plates $111_1$-$111_4$ and the cross-section area of the first field plates $111_1$-$111_4$. Reducing the lateral spacing between adjacent first field plates $111_1$-$111_4$ may increase the capacitance of the plurality of first field plates $111_1$-$111_4$ and make the plurality of first field plates $111_1$-$111_4$ more effective in improving the dynamic breakdown voltage of the high-voltage transistor devices 100, 200 and 300. However, the lateral spacing of the first field plates $111_1$-$111_4$ is limited by manufacturing process constraints, such as photolithography and etching limitations. Increasing the thickness of the plurality of first field plates $111_1$-$111_4$ may also help to increase the capacitance of the plurality of first field plates $111_1$-$111_4$ and make the plurality of first field plates $111_1$-$111_4$ more effective. However, the thickness of the plurality of first field plates $111_1$-$111_4$ is also limited by manufacturing process constraints, such as metal deposition and etching time limitations.

Figure 4:
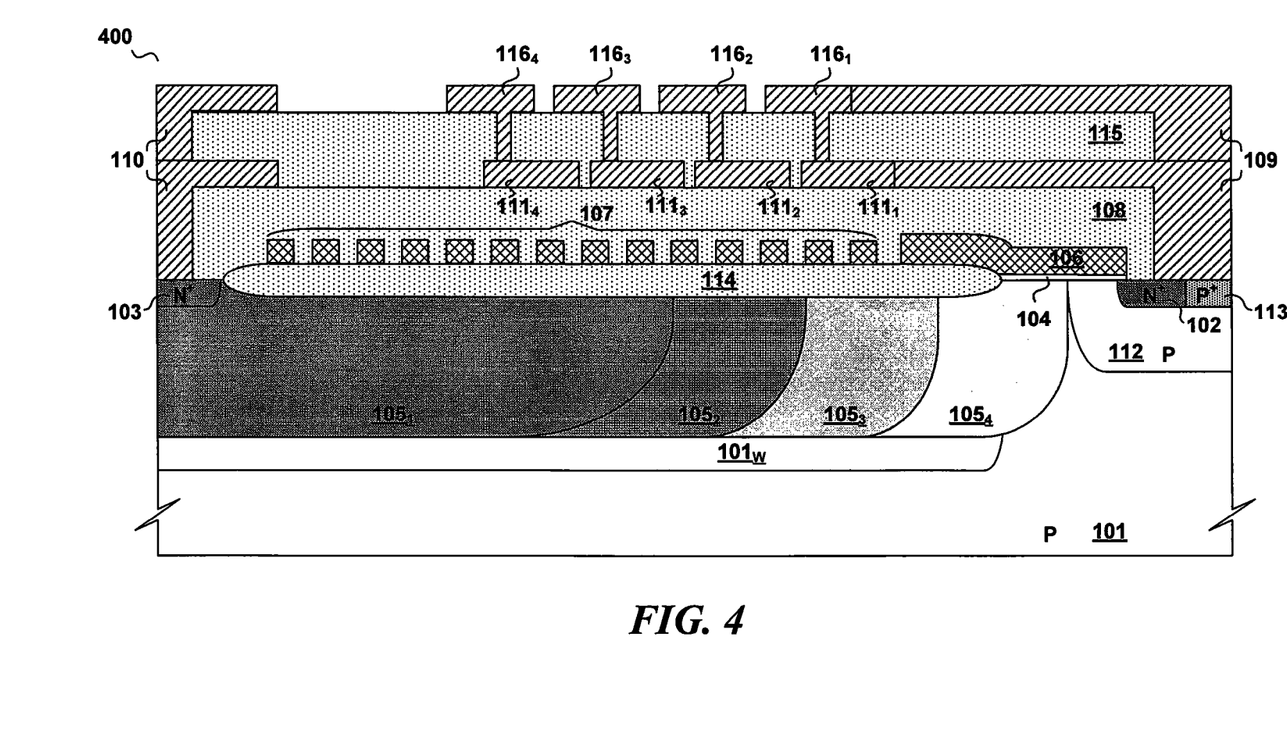
FIG. 4 illustrates a sectional view of a high-voltage transistor device in accordance with another embodiment of the present invention.

FIG. 4 illustrates schematically a sectional view of a high-voltage transistor device 400 in accordance with another embodiment of the present invention. For simplicity, components or structures in the high-voltage transistor device 400 with substantially the same functions as those of the high-voltage transistor devices 100, 200 or 300 are identified by the same reference label as used in the high-voltage transistor devices 100, 200, or 300. As illustrated in FIG. 4, the high-voltage transistor device 400 may further comprise a second dielectric layer 115 covering the first dielectric layer 108 and the plurality of first field plates $111_1$-$111_4$; and a plurality of second field plates $116_1$-$116_4$ arranged atop the second dielectric layer 115 around the source electrode 109, starting from the source electrode 109 and extending towards the drain electrode 110; wherein the plurality of second field plates $116_1$-$116_4$ are isolated from each other; and wherein a starting second field plate (e.g. the field plate $116_1$ in FIG. 4) of the plurality of second field plates $116_1$-$116_4$ is connected to the source electrode 109; and wherein each of the plurality of second field plates $116_1$-$116_4$ is connected to a corresponding underlying first field plate, for example, in the embodiment illustrated in FIG. 4, the second field plate $116_1$ is connected to the first field plate $111_1$, the second field plate $116_2$ is connected to the first field plate $111_2$, the second field plate $116_3$ is connected to the first field plate $111_3$, and the second field plate $116_4$ is connected to the first field plate $111_4$; and wherein each of the plurality of second field plates $116_1$-$116_4$ may extend over a first field plate adjacent to the corresponding first field plate connected to that second field plate, for example, in the embodiment illustrated in FIG. 4, the second field plate $116_1$ extends over the first field plate $111_2$, the second field plate $116_2$ extends over the first field plate $111_3$, the second field plate $116_3$ extends over the first field plate $111_4$, and the second field plate $116_4$ extends beyond the end of the first field plate $111_4$.

In the exemplary embodiment illustrated in FIG. 4, four second field plates $116_1$-$116_4$ are shown, all having the same width and spacing and positioned as concentric circles. In other embodiment, the width of each of the second field plates, the spacing between each of the second field plates and the number of the second field plates may be varied to optimize the device performance. For example, in one embodiment, the plurality of second field plates $116_1$-$116_4$ may not have the same width, the widths of the second field plates $116_1$-$116_4$ may be respectively about 3 μm, 3 μm, 2.5 μm, and 3.8 μm, and the spacing between each of the second field plates $116_1$-$116_4$ may be about 2 μm. In one embodiment, the plurality of second field plates may be arranged all across the second dielectric layer 115 between the source electrode 109 and the drain electrode 110, with a starting first field plate connected to the source electrode 109, and an ending first field plate approaching the drain electrode 110 and capacitively coupled to the drain electrode 110. In other embodiments, the plurality of second field plates may be arranged in non-circular layouts, for example, in fingertype for high-voltage transistors in fingertype.

In one embodiment, the plurality of second field plates $116_1$-$116_4$ may comprise metal field plates. In other embodiment, the plurality of first field plates $116_1$-$116_4$ may comprise other types of conductive field plates that are formed by other conductive materials.

In one embodiment, the plurality of second field plates $116_1$-$116_4$ may be isolated from each other by a second dielectric material. In the exemplary embodiment of FIG. 4, the plurality of first field plates $111_1$-$111_4$ are isolated from each other by the first dielectric layer 108, the plurality of second field plates $116_1$-$116_4$ may be isolated from each other by a passivation layer (not shown in FIG. 4).

The plurality of second field plates $116_1$-$116_2$ may provide more flexibility in adjusting the capacitance of the plurality of first field plates $111_1$-$111_4$ and the plurality of second field plates $116_1$-$116_4$, and may help to further increase the dynamic breakdown voltage of the high-voltage transistor device 400. For example, the capacitance of the plurality of first and second field plates $111_1$-$111_4$ and $116_1$-$116_4$ may be increased by simply increasing the distance of each of the plurality of second field plates $116_1$-$116_4$ extended over the first field plates $111_2$-$111_4$. Thus, the plurality of second field plates $116_1$-$116_4$ may provide more flexibility in optimizing the coupling effectiveness between the spiral resistive field plate 107, the plurality of first field plates $111_1$-$111_4$ and the plurality of second field plates $116_1$-$116_4$, and thus increasing the dynamic breakdown voltage of the high-voltage transistor device 400.

The advantages of the various embodiments of the present invention are not confined to those described above. These and other advantages of the various embodiments of the present invention will become more apparent upon reading the whole detailed descriptions and studying the various figures of the drawings.

Figure 5:
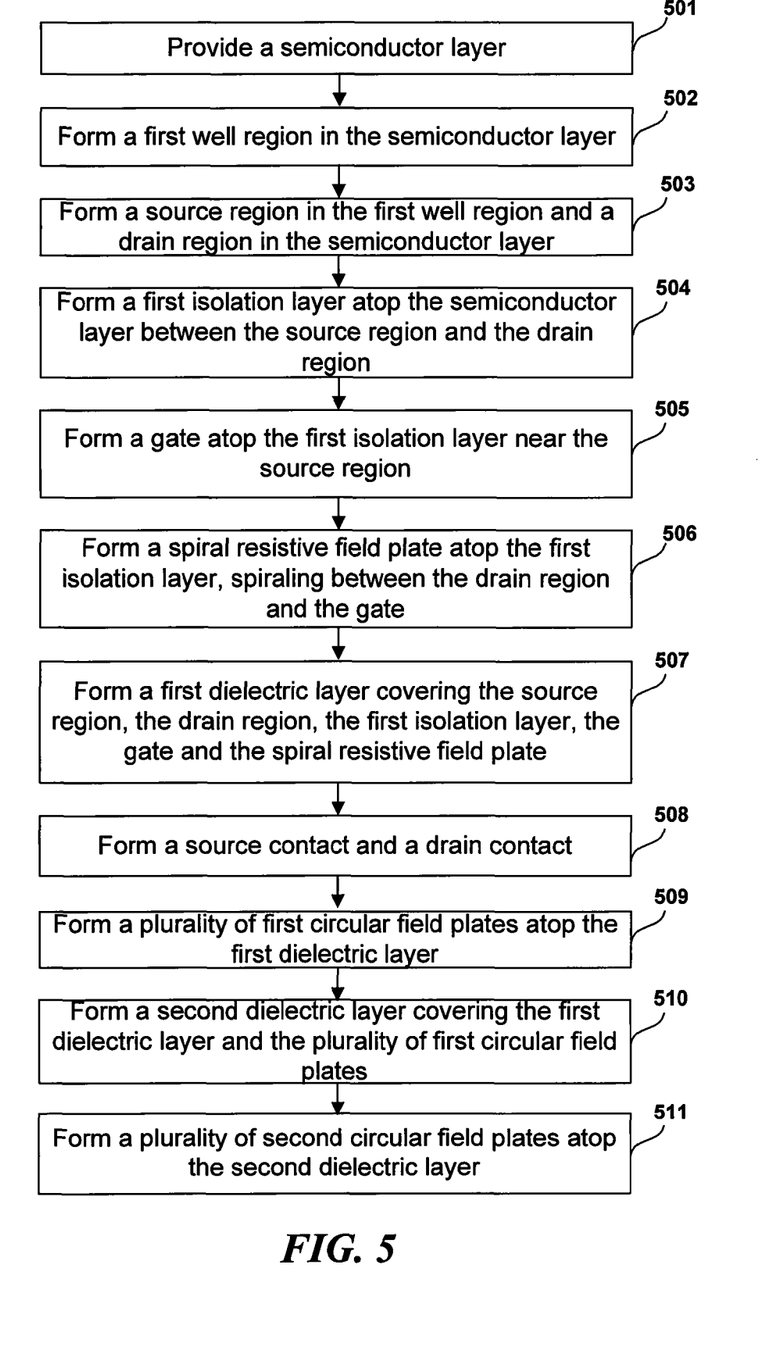
FIG. 5 shows a flow chart illustrating a method of forming a high-voltage transistor device in accordance with an embodiment of the present invention.

FIG. 5 shows a flow chart illustrating a method of forming a high-voltage transistor device in accordance with an embodiment of the present invention. The method comprises: providing a semiconductor layer of a first conductivity type at step 501; forming a first well region of a second conductivity type opposite to the first conductivity type in the semiconductor layer at step 502; forming a drain region of the second conductivity type in the first well region and a source region of the second conductivity type in the semiconductor layer at step 503, wherein the source region and the drain region may have a heavy dopant concentration; forming a first isolation layer atop the semiconductor layer between the source region and the drain region at step 504; forming a gate atop the first isolation layer near the source region at step 505; forming a spiral resistive field plate atop the first isolation layer between the drain region and the gate at step 506, wherein the spiral resistive field plate comprises a first end and a second end; forming a first dielectric layer covering the source region, the drain region, the first isolation layer, the gate and the spiral resistive field plate at step 507; forming a source electrode and a drain electrode at step 508, wherein the source electrode is coupled to the source region and the first end of the spiral resistive field plate, and wherein the drain electrode is coupled to the drain region and the second end of the spiral resistive field plate; and forming a plurality of first field plates atop the first dielectric layer at step 509, wherein the plurality of first field plates are arranged around the source electrode, starting from the source electrode and extending towards the drain electrode, and wherein the plurality of first field plates are isolated from each other, and wherein a starting first field plate of the plurality of first field plates is connected to the source electrode, and wherein each of the plurality of first field plates covers one or more segments of the spiral resistive field plate.

In one embodiment, in order to reduce processing steps and cost, the spiral resistive field plate may be formed using a same layer that is used to form the gate. For example, at the step 505, a lightly-doped or undoped layer of polysilicon may be formed on the first isolation layer, and then may be doped with a first dose of N-type and/or P-type impurities (e.g. boron with a dose in the range of $1 \times 10^{14}$ cm$^{-3}$ to $1 \times 10^{15}$ cm$^{-3}$) to obtain a desired sheet resistance (e.g. 1 to 10 kohms/square) for the spiral resistive field plate. Subsequently, the polysilicon layer may be patterned and etched to form the spiral resistive field plate and the gate, and the gate may then be doped with a second dose of higher concentration of N-type and/or P-type impurities, for example using the source/drain region implant.

In one embodiment, forming the first well region at step 502 may comprise forming a plurality of second-conductivity-type dopant zones, wherein each second-conductivity-type dopant zone has a different dopant concentration level from the other second-conductivity-type dopant zones. In one embodiment, the plurality of second-conductivity-type dopant zones may have degrading dopant concentration levels in the direction from the dopant zone immediately surrounding the drain region to the dopant zone farthest from the drain region. In one embodiment, the plurality of second-conductivity-type dopant zones may be formed using one or two mask layers. For example, in one embodiment, a first mask layer comprising a plurality of openings having various sizes may be applied for forming the plurality of second-conductivity-type dopant zones so that during an ion implantation step, the mask openings having larger sizes may allow more dopants to enter the semiconductor layer compared to those having smaller sizes. Thus, areas of the semiconductor layer under the mask openings having larger sizes are doped more heavily than areas of the semiconductor layer under the mask openings having smaller sizes. In one embodiment, a single diffusion step (e.g. anneal in a furnace using high temperature) may further be used after the ion implantation step to smooth out the lateral doping profile, yet maintaining a graded lateral doping profile. In another embodiment, in addition to the first mask layer, a second mask layer having a single opening may further be used to introduce a background dopant concentration level that elevates the dopant concentrations of all of the second-conductivity-type dopant zones.

In another embodiment, the method of forming the high-voltage transistor device may further comprise forming a second well region of the first conductivity type surrounding the source region at the step 503.

In another embodiment, the method of forming the high-voltage transistor device may further comprise forming a body contact region of the first conductivity type with a heavy dopant concentration next to the source region at the step 503, wherein the body contact region is coupled to the source electrode. In another embodiment, the method of forming the high-voltage transistor device may further comprise forming a body electrode, wherein the body contact region is coupled to the body electrode instead of the source electrode.

In another embodiment, the method of forming the high-voltage transistor device may further comprise forming a third well region of the first conductivity type in the semiconductor layer underneath the first well region at the step 502, wherein the third well region has a higher dopant concentration than the semiconductor layer.

In still another embodiment, the method of forming the high-voltage transistor device may further comprise forming a gate electrode coupled to the gate at the step 508, wherein the first end of the spiral resistive field plate is coupled to the gate electrode instead of the source electrode.

In still another embodiment, the method of forming the high-voltage transistor device may further comprise forming a thick dielectric layer over a portion of the first well region to laterally isolate the drain region from the gate and the source region at the step 504, wherein the gate may have a portion extending on top of the thick dielectric layer, and wherein the spiral resistive field plate is atop the thick dielectric layer instead of the first isolation layer.

In yet another embodiment, the method of forming the high-voltage transistor device may further comprise forming a second dielectric layer covering the first dielectric layer and the plurality of first field plates at step 510; and forming a plurality of second field plates atop the second dielectric layer at step 511, wherein the plurality of second field plates are arranged around the source electrode, starting from the source electrode and extending towards the drain electrode, and wherein the plurality of second field plate are isolated from each other, and wherein a starting second field plate of the plurality of second field plates is connected to the source electrode, and wherein each of the plurality of second field plates is connected to a corresponding underlying first field plate, and wherein each of the plurality of second field plates extends over a first field plate adjacent to the corresponding first field plate connected to that second field plate.

Methods and processes of forming a high-voltage transistor device described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

Although the present disclosure takes an N-channel high-voltage transistor device for example to illustrate and explain the structures of a high-voltage transistor device according to various embodiments of the present invention, this is not intended to be limiting and persons of skill in the art will understand that the structures and principles taught herein also apply to P-channel high-voltage transistor devices and to other types of semiconductor materials and devices as well.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:

1. A high-voltage transistor device, comprising:
a semiconductor layer of a first conductivity type;
a source region of a second conductivity type opposite to the first conductivity type in the semiconductor layer;
a drain region of the second conductivity type in the semiconductor layer separated from the source region;
a first isolation layer atop the semiconductor layer between the source region and the drain region;
a first well region of the second conductivity type surrounding the drain region, extending towards the source region and separated from the source region;
a gate atop the first isolation layer between the source region and the first well region;

a spiral resistive field plate atop the first isolation layer between the drain region and the gate, wherein the spiral resistive field plate comprises a first end and a second end;

a first dielectric layer covering the source region, the drain region, the first isolation layer, the gate and the spiral resistive field plate;

a source electrode electrically coupled to the source region and the first end of the spiral resistive field plate;

a drain electrode electrically coupled to the drain region and the second end of the spiral resistive field plate; and a plurality of first field plates atop the first dielectric layer, wherein the plurality of first field plates are arranged around the source electrode, starting from the source electrode and extending towards the drain electrode, wherein the plurality of first field plates are isolated from each other, wherein a starting first field plate of the plurality of first field plates is connected to the source electrode, wherein each of the plurality of first field plates covers one or more segments of the spiral resistive field plate.

2. The high-voltage transistor device of claim 1, wherein the first well region comprises a plurality of second-conductivity-type dopant zones, and wherein each second-conductivity-type dopant zone has a different dopant concentration from the other second-conductivity-type dopant zones.

3. The high-voltage transistor device of claim 1, wherein the first well region comprises a plurality of second-conductivity-type dopant zones having degrading dopant concentrations in a direction from the dopant zone immediately surrounding the drain region to the dopant zone farthest from the drain region.

4. The high-voltage transistor device of claim 1 further comprising a second well region of the first conductivity type surrounding the source region.

5. The high-voltage transistor device of claim 1 further comprising a body contact region of the first conductivity type next to the source region, wherein the body contact region is coupled to the source electrode.

6. The high-voltage transistor device of claim 5 further comprising a body electrode separated from the source electrode, wherein the body contact region is coupled to the body electrode instead of the source electrode.

7. The high-voltage transistor device of claim 1 further comprising a third well region of the first conductivity type in the semiconductor layer beneath the first well region, wherein the third well region has a higher dopant concentration than the semiconductor layer.

8. The high-voltage transistor device of claim 1, wherein the first end of the spiral resistive field plate is coupled to the gate instead of being coupled to the source region.

9. The high-voltage transistor device of claim 1 further comprising a thick dielectric layer over a portion of the first well region to laterally isolate the drain region from the gate and the source region, wherein the gate comprises a portion extending on top of the thick dielectric layer, and wherein the spiral resistive field plate is atop the thick dielectric layer instead of the first isolation layer.

10. The high-voltage transistor device of claim 1 further comprising:

a second dielectric layer covering the first dielectric layer and the plurality of first field plates; and a plurality of second field plates atop the second dielectric layer, wherein the plurality of second field plates are arranged around the source electrode, starting from the source electrode and extending towards the drain electrode, and wherein the plurality of second field plates are isolated from each other, and wherein a starting second field plate of the plurality of second field plates is connected to the source electrode, and wherein each of the plurality of second field plates is connected to a corresponding underlying first field plate, and wherein each of the plurality of second field plates extends over a first field plate adjacent to the corresponding first field plate connected to that second field plate.

* * * * *